(12) United States Patent
Kravtchenko et al.

(10) Patent No.: US 6,665,252 B1
(45) Date of Patent: Dec. 16, 2003

(54) METHOD AND APPARATUS FOR DETERMINING THE VALUE OF SAMPLES RECEIVED FROM BITSTREAM DATA STORED ON A STORAGE MEDIUM, AND FOR RECOVERING BITS OF SAID BITSTREAM USING A VITERBI DETECTOR

(75) Inventors: Alexander Kravtchenko, Villingen-Schwenningen (DE); Marten Kabutz, Villingen-Schwenningen (DE); Bruno Peytavin, Grenoble (FR)

(73) Assignee: Thomson Licensing S.A., Boulogne (FR)

( * ) Notice: Subject to any disclaimer, the term of this patent is extended or adjusted under 35 U.S.C. 154(b) by 497 days.

(21) Appl. No.: 09/717,418

(22) Filed: Nov. 21, 2000

(30) Foreign Application Priority Data

Nov. 30, 1999 (EP) .............................. 99250423

(51) Int. Cl.$^7$ ................................ G11B 7/00
(52) U.S. Cl. .................. 369/59.22; 369/59.1; 369/47.1
(58) Field of Search .............................. 369/47.1, 47.15, 369/47.28, 47.35, 53.1, 53.35, 59.1, 59.21, 59.22, 59.23, 59.27

(56) References Cited

U.S. PATENT DOCUMENTS

| | | | |
|---|---|---|---|
| 5,327,440 A | * | 7/1994 | Fredrickson et al. ........ 714/795 |
| 5,506,827 A | | 4/1996 | Tobita ........................... 369/59 |
| 5,739,783 A | | 4/1998 | Tajima ........................... 341/59 |
| 6,216,249 B1 | * | 4/2001 | Bliss et al. .................. 714/792 |

FOREIGN PATENT DOCUMENTS

EP 0750306 A2 12/1996

OTHER PUBLICATIONS

H. Hayashi, H. Kobayashi, M. Umezawa, S. Hosake and H. Hirano, *DVD Players Using a Viterbi Decoding Circuit*, IEEE Transactions on Consumer Electronics, vol. 44, No. 2, May, 1998, pp. 268–271, XP002137442.

IEE Transactions #2 vol. 44, May 1998 pp. 268–271.

* cited by examiner

*Primary Examiner*—Muhammad Edun
(74) *Attorney, Agent, or Firm*—Joseph S. Tripoli; Harvey D. Fried; Francis A. Davenport

(57) ABSTRACT

DVDs have currently the highest storage density among the optical discs of practical use. Due to the high storage density the reproduced signal is deteriorated by noise caused by inter-symbol interference, crosstalk, focus error, or mastering errors. A conventional threshold bit detector generates a high bit error rate in case of low SNR. For accurate reproduction of digital data from a DVD under low SNR conditions, a specific Viterbi detector is used which performs maximum likelihood sequence estimation.

12 Claims, 3 Drawing Sheets

METHOD AND APPARATUS FOR
DETERMINING THE VALUE OF SAMPLES
RECEIVED FROM BITSTREAM DATA
STORED ON A STORAGE MEDIUM, AND
FOR RECOVERING BITS OF SAID
BITSTREAM USING A VITERBI DETECTOR

FIELD OF THE INVENTION

The invention relates to optical disk data reproduction, in particular to regenerating data signals that have been recorded based on a duo-binary (1+D) partial response characteristic.

BACKGROUND OF THE INVENTION

DVDs (digital versatile disc) have currently the highest storage density among the optical discs of practical use. Due to the high storage density the reproduced signal is deteriorated by noise caused by inter-symbol interference, crosstalk, focus error, mastering errors.

It is a well-known fact that the signal-to-noise ratio SNR influences the detecting performance of a bit detector. A conventional bit detector, for example a threshold detector, generates a high bit error rate in case of low SNR.

For accurate reproduction of digital data from a DVD under low SNR conditions, a Viterbi detector or Viterbi algorithm can be used which performs maximum likelihood sequence estimation MLSE.

MSLE and Viterbi algorithms are disclosed in e.g.:
"The Viterbi Algorithm", G. D. Forner, Proceedings of IEEE, Vol. 61, No. 3, March 1973, pp. 268–278;
"Maximum-Likelihood Sequence Estimation of Digital Sequences in the Presence of Intersymbol Interference", G. D. Forner, IEEE Transactions on Information Theory, Vol. 18, No. 3, May 1972, pp. 363–378.

Applications of MLSE or Viterbi algorithms with a partial response (PR) system are disclosed in e.g.:
"A PRML System for Digital Magnetic Recording", R. D. Cideciyan, F. Dolivo, R. Hermann, W. Hirt, W. Schott, IEEE JOURNAL ON SELECTED AREAS IN COMMUNICATIONS, Vol. 10, No. 1, January 1992, pp. 38–56;
"Viterbi Detection of Class IV Partial Response on a Magnetic Recording Channel", R. W. WOOD, D. A. Petersen, IEEE Transactions on Communications, Vol. COM-34, No. 5, May 1986, pp. 454–461;
"Variations on the FERGUSON Viterbi Detector", J. W. M. Bergmans, K. D. Fisher, H. W. Wong-Lam, Philips Journal of Research, Vol. 47, No. 6, 1993, pp. 361–386;
"Optimal reception for binary partial response channels", M. J. Ferguson, Bell Systems, Technical Journal 51 (2), 1972, pp. 410–30;
"A study of digital auto equalizer and PLL system using Maximum Likelihood Error for digital VCRs", J. Tonami, T. Kiyofuji, A. Suyama, IEEE Transactions on Consumer Electronics, Vol. 43, No. 3, August 1997;
"New Feedback Viterbi Decoder for digital VCRs", S. Kitaori, IEEE Transactions on Consumer Electronics, Vol. 41, No. 3, August 1995;
"On the application of sequence estimation algorithms in the Digital Compact Cassette (DCC)", V. Braun, K. A. Schouhamer Immink, M. A. Ribeiro, G. J. van den Enden, IEEE Transactions on Consumer Electronics, Vol. 40, No. 4, November 1994.

Applications of Viterbi detectors are described in EP-A-0 644 661, U.S. Pat. No. 5,392,316, and U.S. Pat. No. 4,571, 734.

The above mentioned documents concern the application of a Viterbi Detector to the class IV partial response on a magnetic recording channel only and are not suitable for an optical recording channel.

"DVD players using a Viterbi Decoding Circuit", H. Hayashi, H. Kobayashi, M. Umezawa, S. Hosaka, H. Hirano, IEEE Transactions on Consumer Electronics, Vol. 44, No. 2, May 1998, discloses Viterbi decoding in a DVD player.

SUMMARY OF THE INVENTION

A problem to be solved by the invention is to disclose a method and an apparatus for Viterbi detection, which are suitable for an optical channel with low SNR values.

The recorded data are reconstructed in a special Viterbi detector using a partial response class 1 characteristic, i.e. a (1+D) signalling technique. The signal obtained from the recording signal has three values corresponding to e.g. −2,0, +2, respectively. The Viterbi detector treats a sequence of such signals. When the maximum likelihood (ML) data is detected, the ML data transition path leading to the detected data is searched and the bits on the resulting ML data transition path are assumed to correspond to the originally recorded signal data.

Using the inventive Viterbi detector in the replay section of a DVD player leads to decreased video data output error rate and improves the quality of the correspondingly displayed signal.

In principle, the inventive method is suited for determining the value of samples received from data stored on a storage medium, said data representing a bitstream, and for recovering bits of said bitstream using a Viterbi detector, and includes the following steps:

calculating for the received sample values a corresponding center value, wherein for providing center value calculation input samples from a received original sample value a previously calculated center value is subtracted;

converting said center value calculation input samples by adding a succeeding one to a current one;

calculating, based on said converted center value calculation input samples, branch metric values using a Trellis diagram;

calculating in each case two differential branch metric values from said branch metric values;

calculating a sign value for each of said converted center value calculation input samples;

calculating path metric memory control values using said differential branch metric values and said sign values;

generating the corrected bit values of said bitstream to be recovered using a path metric memory stage, which is controlled by said path metric memory control values.

In principle the inventive apparatus is suited for determining the value of samples received from data stored on a storage medium, said data representing a bitstream, and for recovering bits of said bitstream using a Viterbi detector, and includes:

means for calculating for the received sample values a corresponding center value, wherein for providing center value calculation input samples from a received original sample value a previously calculated center value is subtracted;

means for converting said center value calculation input samples by adding a succeeding one to a current one;

means for calculating, based on said converted center value calculation input samples, branch metric values using a Trellis diagram;

means for calculating in each case two differential branch metric values from said branch metric values;

means for calculating a sign value for each of said converted center value calculation input samples;

means for calculating path metric memory control values using said differential branch metric values and said sign values;

a path metric memory stage for generating the corrected bit values of said bitstream to be recovered, which is controlled by said path metric memory control values.

BRIEF DESCRIPTION OF THE DRAWINGS

Embodiments of the invention are described with reference to the accompanying drawings, which show in.

DETAILED DESCRIPTION OF PREFERRED EMBODIMENTS

Figure 1:
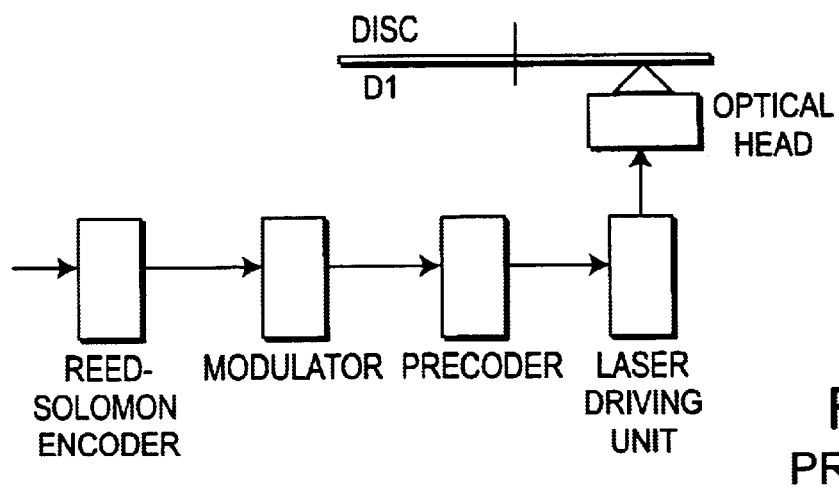
FIG. 1 units or stages of an optical recording system.

FIG. 1 shows relevant units or stages of an optical recording system including an RS (Reed Solomon) encoder RSE, a succeeding run length limited modulator MOD the output data of which become modulated in a precoder PREC in accordance with a partial response class 1 (PR1) characteristic, a succeeding laser driving unit LDU, an optical head OPH and an optical disk DI. Precoder-PREC carries out a $[1/(1+D)]\mod 2$ modulation.

Figure 2:
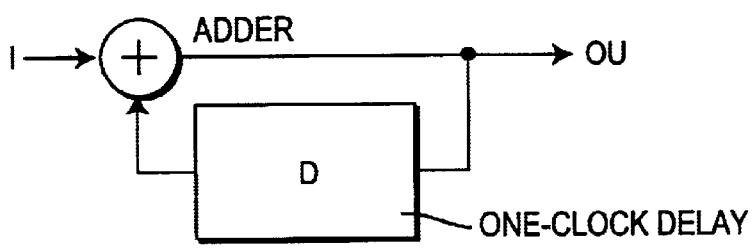
FIG. 2 a precoder.

Precoder PREC is shown in more detail in FIG. 2. To the input signal I an one-clock delayed input signal is added in adder ADD.

ADD supplies the output signal OU, which signal is also passed through a one-clock delay D to the other adder input.

Figure 3:
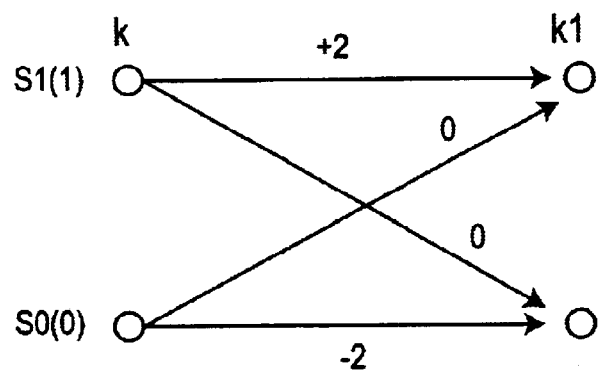
FIG. 3 a Trellis diagram.

The signal obtained from the (1+D) signalling technique recording signal has three possible values '−2', '0', and '+2', as shown in the Trellis diagram in FIG. 3. 'k' denotes a current value and 'k1' a value succeeding in time.

Figure 4:
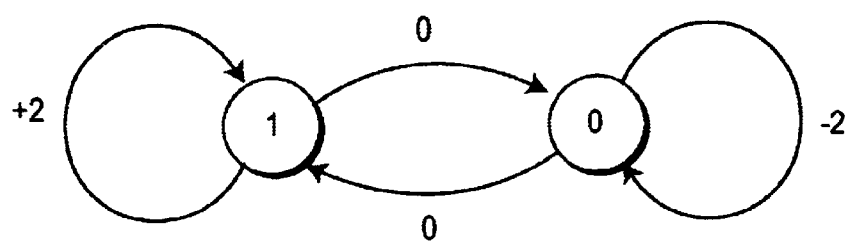
FIG. 4 a status transition diagram.

For the recording signal bits '0' and '1' there are the four data transitions paths depicted in the status transition diagram in FIG. 4:

a) a transition path from '1' to '1';

b) a transition path from '0' to '0';

c) a transition path from '1' to '0';

d) a transition path from '0' to '1'.

These data transition paths are shown in the Trellis diagram of FIG. 3. The data transition path from '1' to '1' corresponds to a value '+2' of the signal obtained by (1+D) partial response signalling. This data transition status is defined in the following as 'merge+'. The data transition path from '0' to '0' corresponds to a value '−2' of the signal obtained by (1+D) partial response signalling. This data transition status is defined in the following as 'merge−'. The data transition paths from '0' to '1' and from '1' to '0' correspond to a value '0' of the signal obtained by the (1+D) partial response signalling. These both data transition states are defined as 'merge0'.

Figure 5:
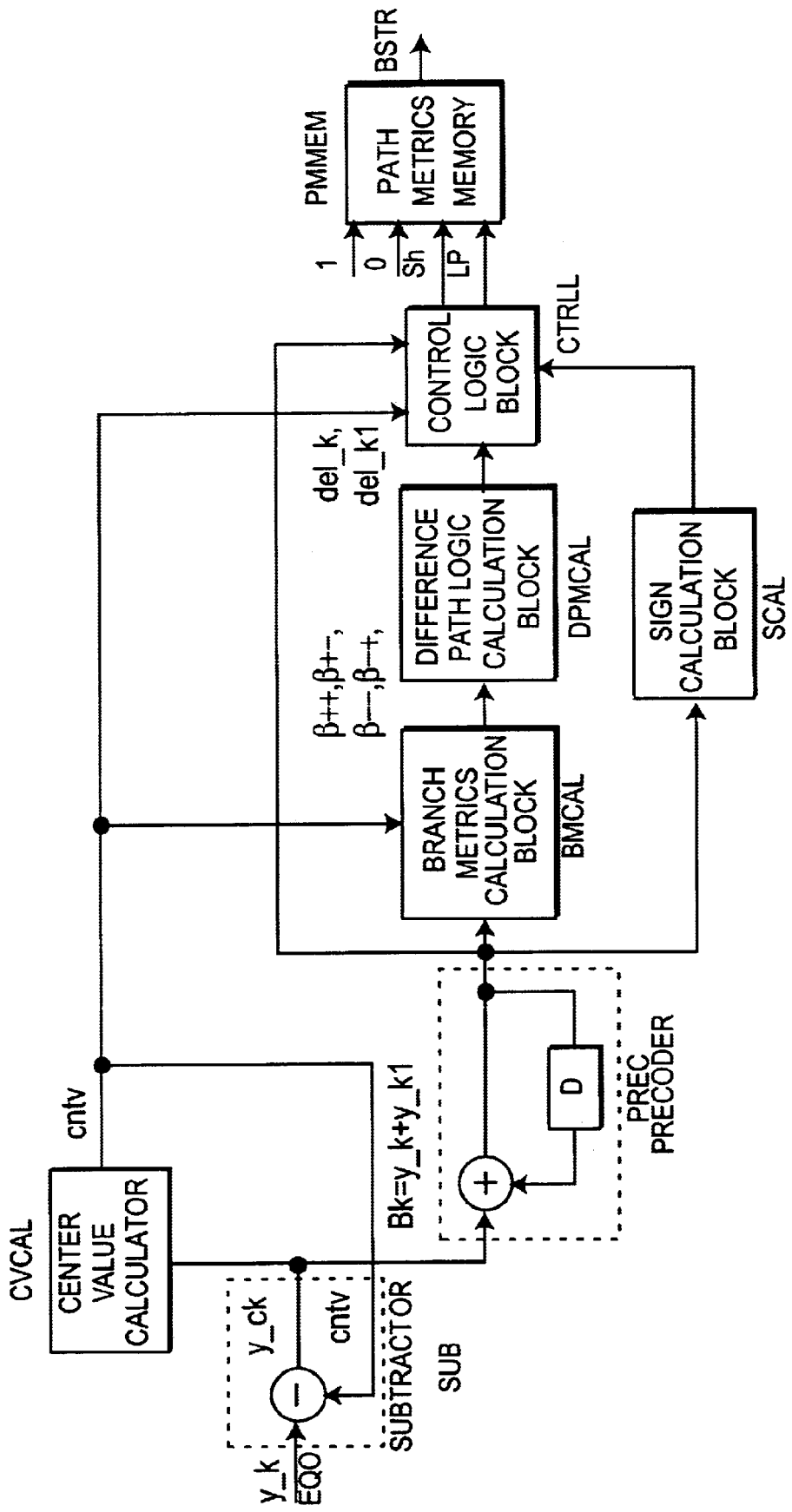
FIG. 5 a Viterbi detector according to the invention.

The inventive Viterbi detector architecture, i.e. a maximum likelihood detecting circuit, is shown in FIG. 5 and includes:

Center Value Calculation Block

In a center value calculator CVCAL the center values cntv of HF signal samples are computed according to the algorithm $$cntv\_k1 = cntv\_k + Ti/T * (y\_k + y\_k1),$$

wherein cntv_k and cntv_k1 are a current and the succeeding center values of the HF signal, Ti is a predetermined time constant (Ti/T is e.g. in the range 0.001 to 0.002), T is the sampling period of the HF signal (T corresponds to delay D in FIG. 2 and has e.g. a value $T=1/(26.16*10^6 \text{ Hz})$), y_k and y_k1 are succeeding sampling values.

Subtractor

Subtractor SUB receives as a first input signal the output sampling values y·_k from an equalizer output EQO. As subtractor output signal y_ck=y_k−cntv_k is calculated and is provided as input signal to CVCAL and to a precoder PREC.

Converter

In precoder PREC the three values '−2', '0', '+2' are calculated from the output of SUB, as described in connection with FIG. 2 and FIG. 3. These values are calculated according to the formula $$Bk = y\_ck + y\_ck1,$$

wherein y_ck and y_ck1 are succeeding values.

Branch Metrics Calculation Block

In block BMCAL, following block PREC, the branch metrics are calculated according to the Trellis diagram described in connection with FIG. 3:

a) Branch metric for a transition path from '1' to '1'

$$\beta++ = (Bk - 2*Am)*(Bk - 2*Am),$$

where Am=k*cntv is a threshold level and advantageous values for k are '0.5', '1' or '2';

b) Branch metric for a transition path from '0' to '0':

$$\beta-- = (Bk + 2*Am)*(Bk + 2*Am);$$

c) Branch metric for the remaining transition paths:

$$\beta-+ = \beta+- = Bk*Bk,$$

where 'β−+' is the branch metric of a transition path from '0' to '1' and 'β+−' is the branch metric of a transition path from '1' to '0'.

BMCAL also receives value 'cntv' as an input signal that is used therein to calculate Am.

Difference Path Metrics Calculation Block

In this block DPMCAL, following block BMCAL, the difference path metrics according to the following algorithm is computed:

$$del\_k1 = Q\_mk1 - Q\_pk1,$$

wherein $Q\_mk1 = \min(del\_k + \beta--, \beta+-)$ and $Q\_pk1 = \min(del\_k + \beta-+, \beta++)$ and del_k=del_k1.

Sign Calculation Block

This block SCAL receives the output signal of PREC and calculates the following expressions:

if (Bk<0) and (Bk1>0) then sgn=−1;

if (Bk>0) and (Bk1<0) then sgn=1;

if (Bk>0) and (Bk1>0) or (Bk<0) and (Bk1<0) then sgn=0, wherein Bk1 is a Bk value following a current Bk value.

Control Logic Block

The control logic block CTRLL receives the output signals of CVCAL, PREC, DPMCAL and SCAL and generates therefrom the signals 'merge−', 'merge+' and 'merge0' to control a path metrics memory PMMEM. CTRLL includes the following logic functions:

if ((sgn<0) AND (del_k≦BpA) AND (del_k1≧0) AND (del_k ≦0)){
   cn=0; (select status 'merge+')
  else if ((sgn>0) AND (del_k≧BmA) AND (del_k1≦0) AND (del_k≧0)){
   cn=2; (select status 'merge−')
  else
   cn=1; (select status 'merge0')

wherein BpA=Bk+Am, BmA=Bk−Am and wherein 'cn' is a value representing one of 'merge−', 'merge0' and 'merge+'. 'Bk' and 'cntv' are fed to CTRLL for calculating BpA, BmA and Am.

Path Metrics Memory

Figure 6:
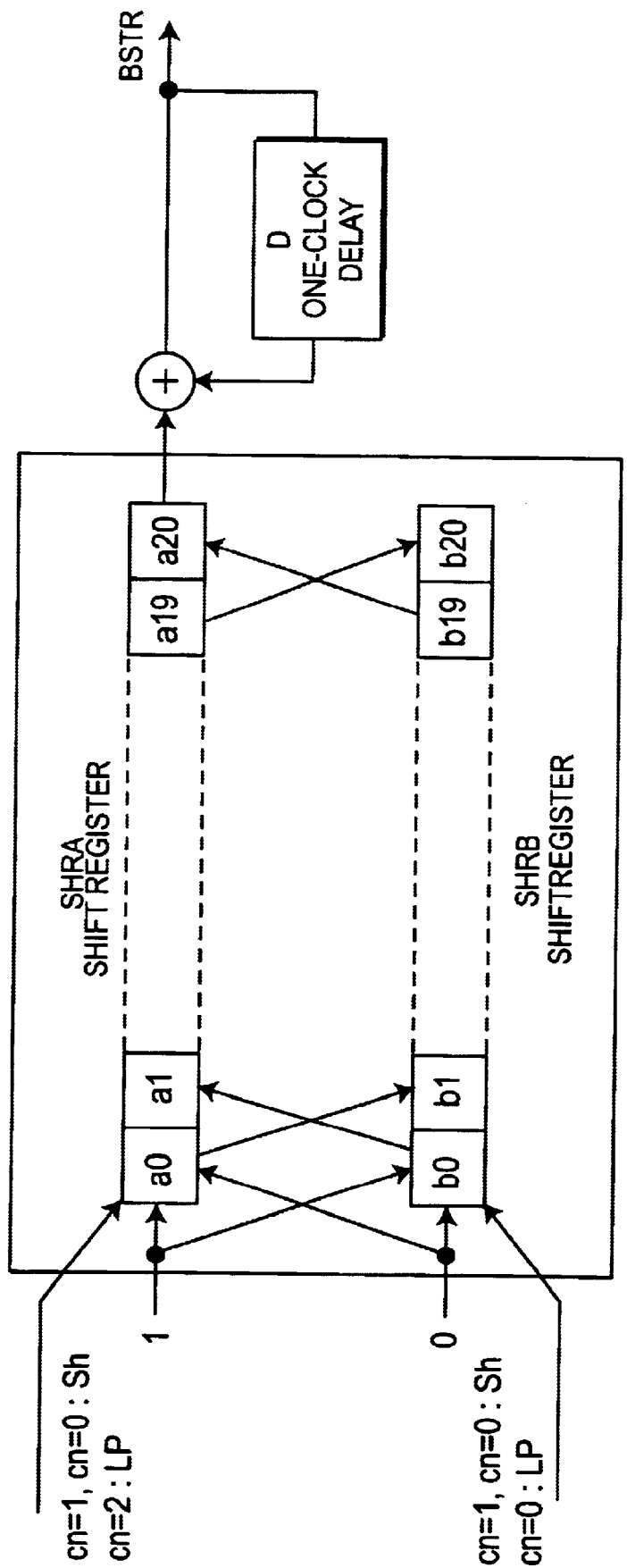
FIG. 6 a path metrics memory circuit.

The path metrics memory PMMEM is shown in more detail in FIG. 6. It outputs a bit-corrected bitstream BSTR. PMMEM may use cross-coupled shift registers SHRA and SHRB which keep track of the surviving paths p_k(1)= [a0, . . . , a20] and p_k(0)=[b0, . . . , b20].

The length of the shift registers can be adapted to the requirements in a current application.

At any time instant k, both shift registers perform either a shift operation Sh or a parallel operation LP under the control of the status values 'merge−', 'merge+' and 'merge0', or cn=2, cn=0 and cn=1 respectively, that are calculated in CTRLL. SHRA performs a shift operation in case of cn=1 or cn=0, and performs a parallel operation in case of cn=2. SHRB performs a shift operation in case of cn=1 or cn=2, and performs a parallel operation in case of cn=0.

The operation signals Sh and LP are generated in CTRLL to control SHRA and SHRB as follows (notation in C language):

```
if(cn==1) {/*merge0, right-shift both registers by one position*/
    for (j=0; j<20; ++j) {
        a[20−j]=a[19−j];
        b[20−j]=b[19−j];
    a[0]=1;
    b[0]=0;
}
if (cn==2) {/*merge−, load in parallel register SHRA from register SHRB, right-shift SHRB by one position*/
    for (j=0; j<20; ++j) a[j+1]=b[j];
    for (j=0; j<20; ++j) b[20−j]=b[19−j];
    a[0]=0;
    b[0]=0;
if (cn==0) {/*merge+, load in parallel register SHRB from register SHRA, right-shift SHRA by one position*/
    for(j=0; j<20; ++j) b[j+1]=a[j];
    for(j=0; j<20; ++j) a[20−j]=a[19−j];
    a[0]=1;
    b[0]=1;
}
```

PMMEM further includes a (1+D)mod2 converter, which is coupled to the output of register SHRA at its a20 element. The converter adds a one-clock (corresponds to T clock or one bit period) delayed previous input value to a current input value and thereby applies a (1+D)mod2 conversion to its input data.

The below table shows real disc simulation results from a conventional threshold detector using peak detection, and from the inventive Viterbi detector. Sampled data from several test discs with different noise types have been evaluated:
  a) Abex vertical deviation test disc;
  b) Toshiba vertical deviation test disc;
  c) RCA fingerprint test disc;
  d) PTD4 fingerprint test disc (PTD4_FP);
  e) PTD4 black dot test disc (PTD4_BDOT);
  f) PTD5 interruption.

The table shows the output byte error rates per ECC block (inner+outer corrections of RS decoder per error correction block ECC) resulting from data sequences with different noise types.

| Test Pattern | Threshold Detector (Channel IC) | Viterbi detector (PRML System) |
|---|---|---|
| ABEX | 847, 3/6 are uncorrectable | 88 |
|  | 816, 4/6 are uncorrectable | 143 |
|  | 647, 3/6 are uncorrectable | 203 |
| TOSHIBA | 29 | 2 |
|  | 41 | 21 |
|  | 7 | 1 |
| RCA | 35 | 19 |
|  | 57 | 24 |
| PTD4_FP | 167 | 77 |
|  | 172 | 72 |
|  | 157 | 40 |
| PTD4_BDOT | 762 | 714 |
|  | 733 | 715 |
| PTD5 | 746 | 747 |
|  | 736 | 737 |

One can see that the inventive Viterbi detector has in the presence of noise like the first four noise types a better detecting quality than a threshold detector. For the two remaining noise types that concern defects on a disc, the inventive Viterbi detector does not achieve an improvement in the detecting process because there is no signal during the defect-playing period.

The invention can also be applied to DVD audio data or other DVD data, and to Video CD data.

What is claimed, is:

1. Method for determining the value of samples received from data stored on a storage medium, said data representing a bitstream, and for recovering bits of said bitstream using a Viterbi detector, including the following steps:
  calculating for the received sample values a corresponding center value, wherein for providing center value calculation input samples from a received original sample value a previously calculated center value is subtracted;
  converting said center value calculation input samples by adding a succeeding one to a current one;
  calculating, based on said converted center value calculation input samples, branch metric values using a Trellis diagram;
  calculating in each case two differential branch metric values from said branch metric values;
  calculating a sign value for each of said converted center value calculation input samples;
  calculating path metric memory control values using said differential branch metric values and said sign values;
  generating the corrected bit values of said bitstream to be recovered using a path metric memory stage, which is controlled by said path metric memory control values.

2. Method according to claim 1, wherein said branch metric calculation provides a first branch metric value for a bit value transition from '1' to '1' and a second branch metric value for a bit value transition from '0' to '0' and a third branch metric value for a bit value transition from either '0' to '1' or '1' to '0'.

3. Method according to claim 1, wherein said sign values are one of three values including a zero value.

4. Method according to claim 1, wherein said path metric memory stage includes cross-coupled shift registers which perform either a shift operation or a parallel operation according to said path metric memory control values, wherein the first shift register receives the value '1' at its signal input and the second shift register receives the value '0' at its signal input and wherein to an output value of said first shift register a succeeding register output value is added in order to form a corrected bit value of said bitstream to be recovered.

5. Method according to claim 1, wherein said storage medium is a high-density optical disc, in particular a DVD.

6. Method according to claim 1, wherein the received original sample values are equalized sample values.

7. Apparatus for determining the value of samples received from data stored on a storage medium, said data representing a bitstream, and for recovering bits of said bitstream using a Viterbi detector, including:

means for calculating for the received sample values a corresponding center value, wherein for providing center value calculation input samples from a received original sample value a previously calculated center value is subtracted;

means for converting said center value calculation input samples by adding a succeeding one to a current one;

means for calculating, based on said converted center value calculation input samples, branch metric values using a Trellis diagram;

means for calculating in each case two differential branch metric values from said branch metric values;

means for calculating a sign value for each of said converted center value calculation input samples;

means for calculating path metric memory control values using said differential branch metric values and said sign values;

a path metric memory stage for generating the corrected bit values of said bitstream to be recovered, which is controlled by said path metric memory control values.

8. Apparatus according to claim 7, wherein said means for branch metric calculation provide a first branch metric value for a bit value transition from '1' to '1' and a second branch metric value for a bit value transition from '0' to '0' and a third branch metric value for a bit value transition from either '0' to '1' or '1' to '0'.

9. Apparatus according to claim 7, wherein said sign values are one of three values including a zero value.

10. Apparatus according to claim 7, wherein said path metric memory stage includes cross-coupled shift registers which perform either a shift operation or a parallel operation according to said path metric memory control values, wherein the first shift register receives the value '1' at its signal input and the second shift register receives the value '0' at its signal input and wherein to an output value of said first shift register a succeeding register output value is added in order to form a corrected bit value of said bitstream to be recovered.

11. Apparatus according to claim 7, wherein said storage medium is a high-density optical disc, in particular a DVD.

12. Apparatus according to claim 7, wherein the received original sample values are equalized sample values.

* * * * *